United States Patent
Suzuki (10) Patent No.: US 8,779,603 B2
(45) Date of Patent: Jul. 15, 2014

(54) STACKED SEMICONDUCTOR DEVICE WITH HEAT DISSIPATION

(75) Inventor: Takehiro Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/701,605

(22) PCT Filed: Jun. 20, 2011

(86) PCT No.: PCT/JP2011/064611
§ 371 (c)(1),
(2), (4) Date: Dec. 3, 2012

(87) PCT Pub. No.: WO2012/002294
PCT Pub. Date: Jan. 5, 2012

(65) Prior Publication Data
US 2013/0075887 A1    Mar. 28, 2013

(30) Foreign Application Priority Data

Jun. 30, 2010   (JP) ................................ 2010-150242
Apr. 20, 2011   (JP) ................................ 2011-093906

(51) Int. Cl.
| | |
|---|---|
| H01L 23/48 | (2006.01) |
| H01L 23/52 | (2006.01) |
| H01L 29/40 | (2006.01) |
| H01L 29/80 | (2006.01) |
| H01L 31/112 | (2006.01) |
| H01L 23/02 | (2006.01) |
| H01L 23/495 | (2006.01) |
| H01L 23/10 | (2006.01) |
| H01L 23/34 | (2006.01) |

(52) U.S. Cl.
USPC ........... 257/778; 257/276; 257/686; 257/675; 257/707; 257/713; 257/777

(58) Field of Classification Search
USPC ......... 257/686, 675, 706–707, 777, 723, 778, 257/773, 786, 276, 712, 713, 720, E33.075, 257/E31.131, E23.051, E23.08
See application file for complete search history.

(56) References Cited

U.S. PATENT DOCUMENTS

| | | | |
|---|---|---|---|
| 6,188,127 B1 | 2/2001 | Senba et al. ................... 257/686 |
| 7,863,101 B2 | 1/2011 | Suzuki et al. ................. 438/109 |
| 2003/0128523 A1* | 7/2003 | Moden et al. .................. 361/719 |
| 2006/0056921 A1 | 3/2006 | Simmons ....................... 405/203 |
| 2008/0246146 A1* | 10/2008 | Kodani et al. ................. 257/737 |
| 2009/0236733 A1 | 9/2009 | Chow et al. .................... 257/713 |
| 2009/0309204 A1 | 12/2009 | Ha ................................ 257/686 |
| 2010/0059873 A1 | 3/2010 | Chow et al. .................... 257/686 |

* cited by examiner

*Primary Examiner* — Matthew Reames
*Assistant Examiner* — Dilinh Nguyen
(74) *Attorney, Agent, or Firm* — Fitzpatrick, Cella, Harper & Scinto (57) ABSTRACT

Provided is a stacked semiconductor device (50) in which a semiconductor package (5) is stacked via connection terminals (8) on a semiconductor package (1), including a heat dissipating member (10) which is disposed between the semiconductor packages (1, 5), is brought into thermal contact with both of the packages (1, 5), and hangs over whole outer peripheral portions of the package (5). Such a structure causes heat generated from the package (5) to be released by heat dissipation into air above the package (5), heat dissipation into the air below the semiconductor package (5), heat transfer via the heat dissipating member (10) and a semiconductor element (3) to a first wiring substrate (2), heat transfer via the connection terminals (8) to the first wiring substrate (2), and heat dissipation via the heat dissipating member (10) into the air, thereby enhancing a temperature reduction effect of the semiconductor element.

2 Claims, 6 Drawing Sheets

STACKED SEMICONDUCTOR DEVICE WITH HEAT DISSIPATION

TECHNICAL FIELD

The present invention relates to a stacked semiconductor device in which two or more semiconductor packages each having a semiconductor element mounted on a wiring substrate are stacked to be mounted three-dimensionally.

BACKGROUND ART

In recent years, various kinds of digital equipment such as digital cameras, digital camcorders, and cellular phones are becoming lighter and more compact, which requires a semiconductor package that may be mounted with a higher density.

Now, as a mode which enables mounting with a high density, a stacked semiconductor device receives attention. A stacked semiconductor device is formed by further connecting a semiconductor package in which a semiconductor element is mounted on a wiring substrate to another semiconductor package. By three-dimensionally disposing semiconductor packages, the footprint may be reduced, which enables mounting with a high density.

However, in a stacked semiconductor device, semiconductor elements which are heat sources are three-dimensionally disposed. Therefore, heat dissipation from the semiconductor elements is not sufficient, and there is a possibility of malfunction and connection defect at a connection terminal due to temperature rise of the semiconductor elements. More specifically, in the case of an ordinary semiconductor package, much of the heat from a semiconductor element is released via a connection terminal to a motherboard. On the other hand, in the case of a stacked semiconductor device, heat from a semiconductor element mounted on a semiconductor package which itself is not directly mounted on a motherboard cannot be sufficiently released to the motherboard.

In order to solve such a problem, U.S. Pat. No. 6,188,127 proposes a method in which, in a stacked semiconductor device, a heat dissipating member is attached to each individual semiconductor package to dissipate heat into the air.

The method described in U.S. Pat. No. 6,188,127 dissipates, via the heat dissipating member, heat into the air, the heat being generated from a semiconductor element mounted on a semiconductor package which itself is not directly mounted on a motherboard. However, the thermal conductivity of air is as low as 0.02 W/mK, and thus, it is hard to say that such heat dissipation into the air is effective.

The amount of heat generated from the semiconductor element becomes larger as the functionality of the semiconductor element increases. Further, the efficiency of heat dissipation decreases as the connection terminal is miniaturized and the number of pins increases for the purpose of mounting with a high density. Therefore, when the amount of generated heat is large, measures including increasing the size of the heat dissipating member are required to be taken. However, there is a limit to the size of the heat dissipating member, and increasing the size thereof to an extreme is impossible in reality.

DISCLOSURE OF THE INVENTION

Accordingly, an object of the present invention is to provide a stacked semiconductor device capable of enhancing an effect of dissipation of heat generated from a semiconductor element of each semiconductor package without using forced air cooling and without increasing the size of the semiconductor packages as much as possible.

In order to attain the above-mentioned object, a stacked semiconductor device according to the present invention includes multiple semiconductor packages each having a semiconductor element mounted on a wiring substrate, the multiple semiconductor packages being stacked on top of one another via connection terminals to be three-dimensionally mounted on a motherboard. The stacked semiconductor device further includes a heat dissipating member disposed between a pair of adjacent semiconductor packages of the multiple semiconductor packages. The heat dissipating member is brought into thermal contact with both of the pair of adjacent semiconductor packages, has openings formed at locations corresponding to the connection terminals so as not to be in contact with the connection terminals, and is formed so as to hang over outer peripheral portions of the pair of adjacent semiconductor packages.

Further features of the present invention will become apparent from the following description of exemplary embodiments with reference to the attached drawings.

DESCRIPTION OF EMBODIMENTS

First Embodiment

Figure 1A:
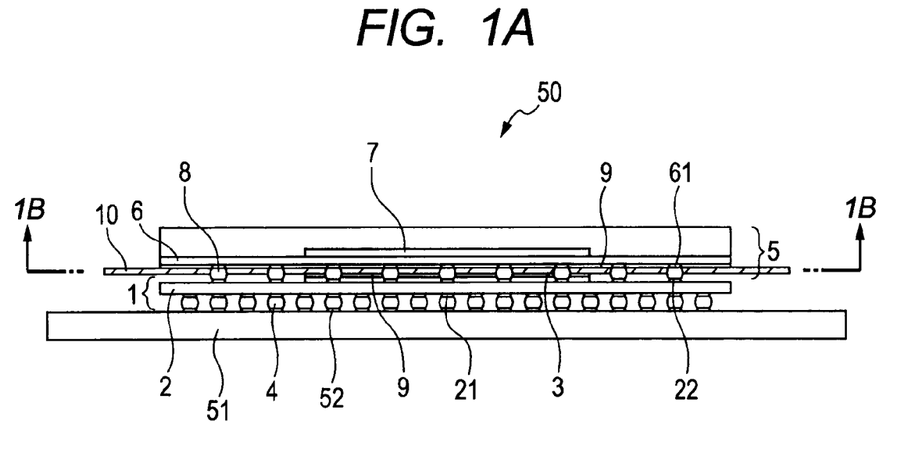
FIGS. 1A and 1B are respectively a sectional view of a stacked semiconductor device and a plan view of a heat dissipating member according to a first embodiment.

A first embodiment for carrying out the present invention is described in detail in the following with reference to the drawings. FIG. 1A is a sectional view of a stacked semiconductor device 50 according to the first embodiment of the present invention.

The stacked semiconductor device 50 includes multiple semiconductor packages, and in this embodiment, includes a first semiconductor package 1 and a second semiconductor package 5. The multiple semiconductor packages 1 and 5 are stacked via ball electrodes, and are three-dimensionally mounted on a motherboard 51. In other words, the stacked semiconductor device 50 in which the second semiconductor package 5 is stacked on the first semiconductor package 1 is mounted on the motherboard 51.

The first semiconductor package 1 includes a first wiring substrate 2 (also referred to as an interposer), a first semiconductor element 3 mounted on one surface (front surface) of the first wiring substrate 2, and multiple connection terminals 4 (solder balls) formed on the other surface (rear surface) of the first wiring substrate 2. The first semiconductor package 1 is mounted on the motherboard 51 via the solder balls 4. Multiple electrode pads 21 are formed on the rear surface of the first wiring substrate 2, while multiple electrode pads 52 are formed on an upper surface of the motherboard 51. The electrode pads 21 and the electrode pads 52 are electrically and mechanically connected to each other via the connection terminals 4, respectively.

The second semiconductor package 5 includes a second wiring substrate 6 (also referred to as an interposer), a second semiconductor element 7 mounted on one surface (front surface) of the second wiring substrate 6, and multiple connection terminals 8 (solder balls) formed on the other surface (rear surface) of the second wiring substrate 6. The second semiconductor package 5 is mounted above (on one surface of) the first semiconductor package 1 via the solder balls 8. Multiple electrode pads 61 are formed on the rear surface of the second wiring substrate 6, while multiple electrode pads 22 are formed on the front surface of the first wiring substrate 2. The electrode pads 61 and the electrode pads 22 are electrically and mechanically connected to each other via the connection terminals 8, respectively.

In this embodiment, each of the wiring substrates 2 and 6 is formed in the shape of a square, and is sized to have sides of 11 mm to 14 mm in general. Each of the semiconductor elements 3 and 7 is also formed in the shape of a square, and is sized to have sides of 5 mm to 9 mm and a thickness of 0.1 mm to 0.2 mm in general.

A heat dissipating member 10 which is a member for dissipating heat is disposed between the pair of adjacent semiconductor packages 1 and 5. The heat dissipating member 10 is brought into thermal contact with both of the pair of semiconductor packages 1 and 5. The heat dissipating member 10 is adhered and fixed to the rear surface of the second wiring substrate 6 of the second semiconductor package 5 with a thermally conductive adhesive 9. Further, the heat dissipating member 10 is adhered and fixed to an upper surface (a surface opposite to a mounting surface) of the first semiconductor element 3 mounted on the first wiring substrate 2 with the thermally conductive adhesive 9. The heat dissipating member 10 is brought into surface contact with the rear surface of the wiring substrate 6 of the semiconductor package 5 and brought into surface contact with the upper surface of the semiconductor element 3 of the semiconductor package 1.

Figure 1B:
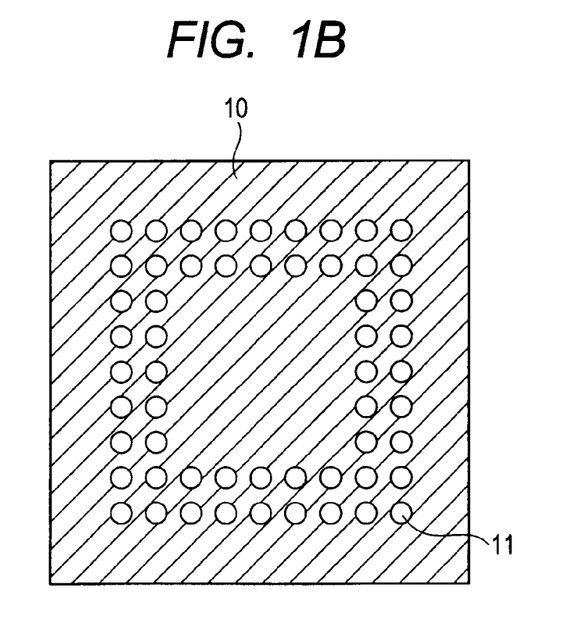

FIG. 1B is a plan view of the heat dissipating member 10 illustrated in FIG. 1A seen from the direction of the arrows X-X. In order to avoid electrical contact with the connection terminals 8, the heat dissipating member 10 has openings 11 provided therein. The number of the openings corresponds to that of the connection terminals 8. The size of the openings 11 is set to be larger than the diameter of the connection terminals 8. Such a structure enables the heat dissipating member 10 to hang over whole peripheries of the semiconductor packages 1 and 5. Such a structure significantly enhances the efficiency of heat dissipation compared to a case in which, as described in U.S. Pat. No. 6,188,127, the connection terminals are disposed in parallel with one another and the heat dissipating member is disposed therebetween. Further, the number of the connection terminals to be disposed may be increased by 30 to 40%.

Note that, the thermally conductive adhesive 9 is, for example, a material in which a highly thermally conductive material such as silver and alumina is added to an epoxy resin. Further, the material of the heat dissipating member 10 is, for example, a highly thermally conductive material such as copper (398 W/mK) or aluminum (236 W/mK).

The heat dissipating member 10 is provided so as to hang over the outer peripheral portions of the pair of semiconductor packages 1 and 5 in all directions. This causes heat generated from the second semiconductor element 7 mounted in the second semiconductor package 5 to be dissipated into the air via the heat dissipating member 10.

Here, it has been found that a heat dissipation effect of the heat dissipating member 10 depends on the amount of the overhang of the heat dissipating member 10. According to a result of a simulation, the heat dissipation effect is great when the amount of the overhang is 6 mm or less, but the heat dissipation effect becomes gradually smaller when the amount of the overhang becomes larger, and the heat dissipation effect almost does not change when the amount of the overhang exceeds 20 mm. From the viewpoint of enhancing the heat dissipation effect, the heat dissipation effect becomes great when the amount of the overhang is as large as about 6 mm, but, taking into consideration the distance to an adjacent component, the amount of the overhang is set to about 2 mm with respect to each side. More specifically, it is preferred that the size of the heat dissipating member 10 be 13 mm to 16 mm and the thickness of the heat dissipating member 10 be 0.1 mm to 0.2 mm. Note that, the thermal conductivity of the wiring substrates 2 and 6 is 0.5 W/mK to 0.6 W/mK, the thermal conductivity of the connection terminals 4 and 8 is 50 W/mK to 60 W/mK, the thermal conductivity of the semiconductor elements 3 and 7 is 110 W/mK to 130 W/mK, and the thermal conductivity of the heat dissipating member 10 is 130 W/mK to 140 W/mK.

Next, a method of manufacturing the stacked semiconductor device is described in brief. The thermally conductive adhesive 9 is applied to the surface of the second wiring substrate 6 of the second semiconductor package 5 on which the second semiconductor element 7 is not mounted. The heat dissipating member 10 is aligned by a mounter or the like and is placed so that the connection terminals 8 pass through the openings 11. After the heat dissipating member 10 is mounted, heat is applied to cure the thermally conductive adhesive 9. Note that, instead of the thermally conductive adhesive 9, a thermally conductive adhesive sheet may be used.

As the thermally conductive adhesive, an epoxy adhesive, a urethane adhesive, or the like may be used, but it is preferred that the thermal conductivity thereof be 10 W/mK or more.

Next, a solder paste is attached to the connection terminals 8 of the second semiconductor package 5 by transfer or the like. Then, the thermally conductive adhesive 9 is applied to an inactive surface of the first semiconductor element 3 of the first semiconductor package 1. Alternatively, a thermally conductive adhesive sheet is in advance placed on the inactive surface of the first semiconductor element 3. Then, the first semiconductor package 1 and the second semiconductor package 5 are aligned, and the second semiconductor package 5 is mounted on the first semiconductor package 1 by a mounter or the like.

After that, by a reflow process or the like, the first semiconductor package 1 and the second semiconductor package 5 are electrically and mechanically connected to each other by the connection terminals 8, and further, the heat dissipating member 10 and the first semiconductor element 3 are adhered to each other. Note that, when the cure of the thermally conductive adhesive is insufficient, additional cure is carried out to adhere the heat dissipating member 10 and the first semiconductor element 3 to each other. By this manufacturing method, the stacked semiconductor device 50 having the heat dissipating member placed therein is completed.

Figure 2A:
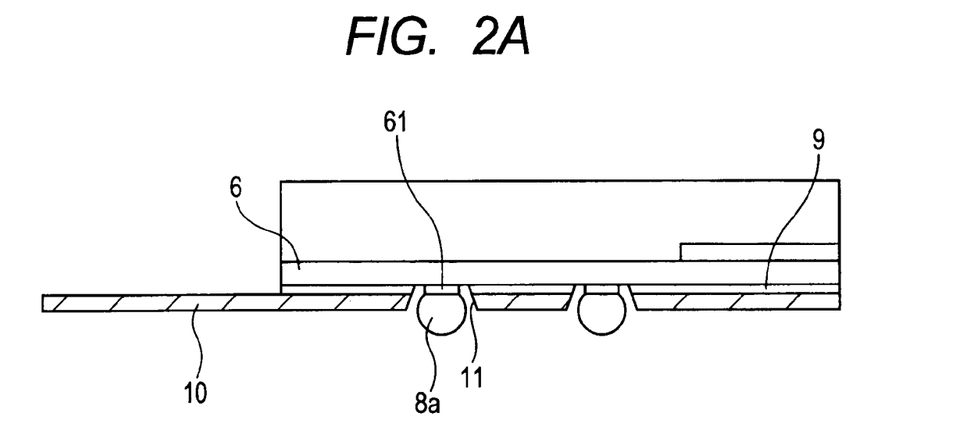
FIGS. 2A and 2B are sectional views of a first semiconductor package according to the first embodiment.
Figure 2B:
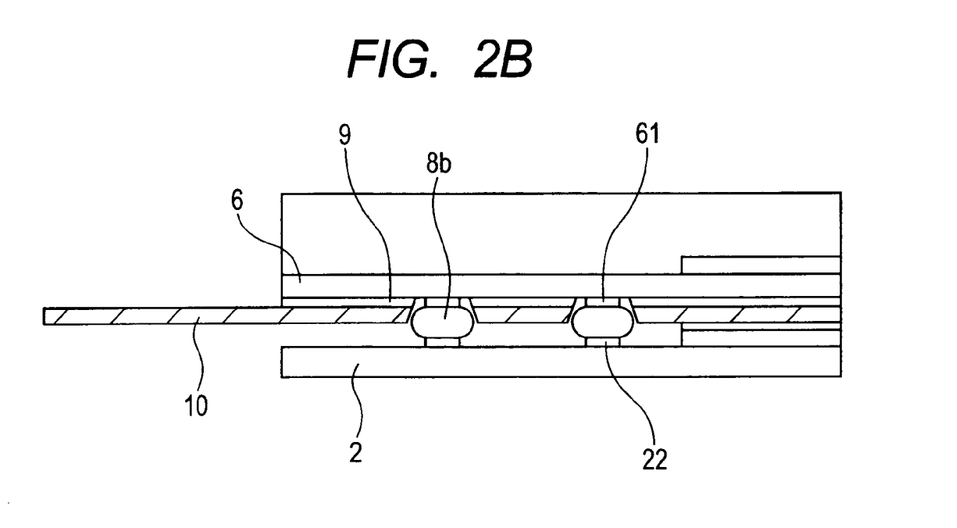

Note that, in order to avoid an electrical short circuit due to contact between the connection terminals 8 and the heat dissipating member 10, the following scheme may be implemented. FIG. 2A is a sectional view before the second semiconductor package 5 is stacked on the first semiconductor package 1. FIG. 2B is a sectional view after the second semiconductor package 5 is mounted on the first semiconductor package 1.

As illustrated in FIGS. 2A and 2B, the openings 11 in the heat dissipating member 10 are formed in a tapered shape which gradually widens from the second semiconductor package 5 side toward the first semiconductor package 1 side. This is because connection terminals 8a before the mounting which are illustrated in FIG. 2A contract in a vertical direction and expand in a horizontal direction after the mounting as illustrated in FIG. 2B. It is thus effective to form the openings 11 in a tapered shape so as to follow the shape of connection terminals 8b after the mounting.

Ordinarily, the diameter of the openings 11 on the side of the second wiring substrate 6 of the second semiconductor package 5 is set to be larger than the diameter of the connection terminals 8a by about 0.02 mm taking into consideration the accuracy of mounting the heat dissipating member 10. More specifically, when the diameter Φ of the connection terminals 8a is about 0.2 mm to 0.3 mm, the diameter Φ of the openings on the second wiring substrate 6 side is set to about 0.22 mm to 0.32 mm. Meanwhile, when the second semiconductor package 5 is mounted on the first semiconductor package 1, the shape of the connection terminals 8 expands in the horizontal direction by about 15%. Therefore, the diameter Φ of the connection terminals 8 becomes about 0.23 mm to 0.35 mm, and thus, the diameter Φ of the openings on the first wiring substrate 2 side is set to about 0.25 mm to 0.37 mm.

Figure 3:
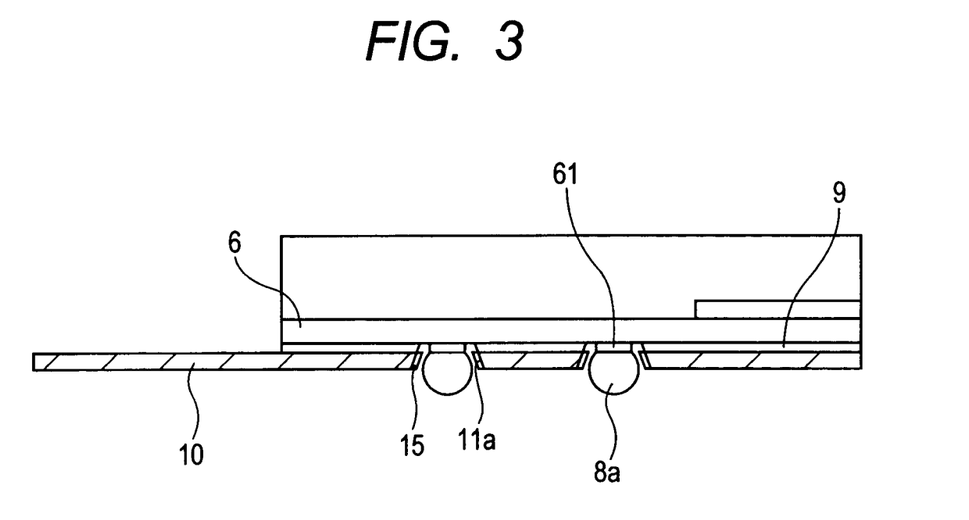
FIG. 3 is a sectional view of the first semiconductor package according to the first embodiment.

Further, as illustrated in FIG. 3, the openings 11 may be subjected to insulation treatment. An insulating member 15 is applied to a side surface 11a of each of the openings 11. It is preferred that an insulating resin or the like be used as the insulating member 15, and further, in order not to impair the heat dissipation effect, it is preferred that the insulating member 15 be placed only in the openings 11.

Figure 4A:
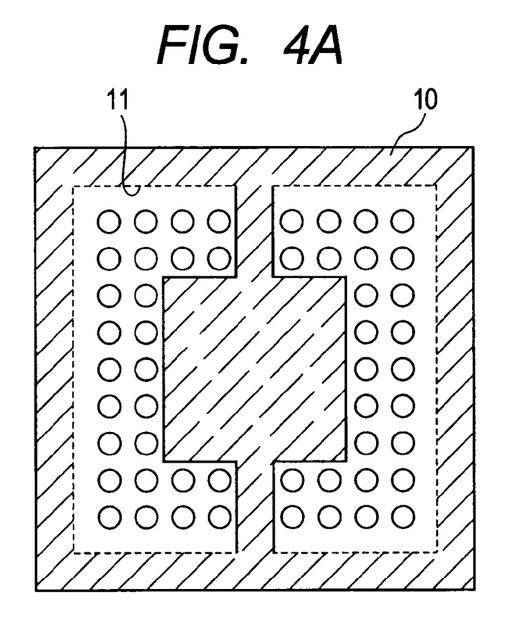
FIGS. 4A and 4B are plan views of heat dissipating members according to the first embodiment.
Figure 4B:
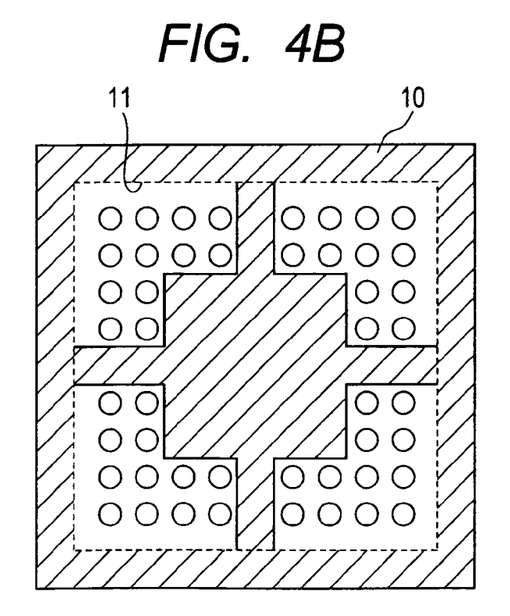

With regard to the shape of the openings 11, instead of forming the openings 11 for the respective connection terminals as illustrated in FIG. 1B, the openings 11 may be formed as two regions or four regions according to the arrangement of and the intervals between the connection terminals as illustrated in FIG. 4A or 4B. Multiple connection terminals are disposed in one region. The efficiency of heat dissipation is the highest when the shape is as illustrated in FIG. 1B, but, taking into consideration the easiness of manufacture, the shape may be as illustrated in FIG. 4A or 4B.

Note that, in the above-mentioned embodiment, a case in which the ball electrodes are solder electrodes is described, but the present invention is not limited thereto, and the ball electrodes may be electrodes formed by applying solder to ball-shaped rigid bodies.

Further, in the above-mentioned embodiment, a case in which one semiconductor element is mounted on each wiring substrate is described, but the present invention may also be applied to a case in which multiple semiconductor elements are mounted. In that case, the semiconductor elements may be mounted in any one of a stacked package and a single package.

Further, in the above-mentioned embodiment, a case in which the number of the semiconductor packages is two is described, but the present invention may also be applied to a case in which three or more semiconductor packages are stacked. In this case, a heat dissipating member only needs to be disposed between each pair of adjacent semiconductor packages.

Further, in the above-mentioned embodiment, the second semiconductor package 5 has an encapsulating resin for covering the second semiconductor element 7, but the present invention is not limited thereto. Further, in this embodiment, one semiconductor element is mounted on each of the first semiconductor package 1 and the second semiconductor package 5, but multiple semiconductor elements may be mounted.

Further, in the above-mentioned embodiment, a case in which the semiconductor elements are mounted on the surfaces of the wiring substrates which are opposite to the motherboard side, respectively, is described, but the present invention may also be applied to a case in which, inversely, the semiconductor elements are mounted on the surfaces of the wiring substrates which are on the motherboard side, respectively.

Further, in the above-mentioned embodiment, a case in which the semiconductor packages are in the shape of a square is described, but the shape may be a quadrangle other than a square. Alternatively, the shape may be a polygon other than a quadrangle, which includes a shape in which corners at which sides intersect each other are cut or curved. Further, the shape may include all shapes other than a polygon, for example, a circle or an ellipse, seen in plan view.

Further, the mode for forming the semiconductor element on the wiring substrate is not specifically limited, and the semiconductor element and the wiring substrate may be connected by flip chip mounting or wire bonding and then be covered with a mold resin or the like.

In the stacked semiconductor device 50 of this embodiment, the pair of semiconductor packages 1 and 5 are brought into thermal contact with each other by the heat dissipating member 10. This causes heat generated from the second semiconductor element 7 of the second semiconductor package 5 to be released by the following five paths.

(1) heat dissipation into the air above the second semiconductor package.
(2) heat dissipation into the air below the second semiconductor package.
(3) heat transfer via the heat dissipating member 10 and the semiconductor element 3 to the first wiring substrate 2.
(4) heat transfer via the connection terminals 8 to the first wiring substrate 2.
(5) heat dissipation into the air via the heat dissipating member 10.

By forming those five paths, the heat dissipation effect of the second semiconductor element 7 may be enhanced.

Note that, heat transferred to the first wiring substrate 2 is then transferred via the connection terminals 4 to the motherboard 51. Further, in the second path in which heat is dissipated into the air, the heat dissipating member 10 hangs over the whole outer peripheral portions of the second semiconductor package 5, and thus, the heat dissipation effect of the heat dissipating member 10 into the air is enhanced.

Note that, a semiconductor element generally used is highly likely to malfunction when the temperature exceeds 120° C. When the temperature is between 120° C. and 140° C., the possibility of the malfunction increases as the temperature rises by 1° C. It has been known that, when the temperature becomes 140° C. or higher, the possibility of the malfunction is very high, but temperature rise has little effect. Therefore, it is technically very significant to lower the temperature of a semiconductor element by 1° C. when the temperature is between 120° C. and 140° C.

Example 1

In order to confirm the heat reduction effect of the stacked semiconductor device 50, thermal fluid analysis software (FLoTHERM V8.2 manufactured by Mentor Graphics) was used to perform a simulation. The shape and size of the simulation model of the stacked semiconductor device 50 were as follows.

The first wiring substrate 2 of the first semiconductor package 1 was a substrate in the shape of a square of 11.5 mm×11.5 mm. The thermal conductivity of the first wiring substrate 2 was 80 W/mK in a plane direction and was 0.5 W/mK in a thickness direction. The first semiconductor element 3 was in the shape of a square of 5 mm×5 mm and had a thickness of 0.05 mm. The thermal conductivity of the first semiconductor element 3 was 117.5 W/mK in the plane direction at 25° C. The number of the connection terminals 4 formed was 441, and the connection terminals 4 were in the shape of a square prism having a section which is a square of 0.34 mm×0.34 mm and having a height of 0.2 mm.

The second wiring substrate 6 of the second semiconductor package 5 was a substrate in the shape of a square of 11.5 mm×11.5 mm. The thermal conductivity of the second wiring substrate 6 was 80 W/mK in the plane direction and was 0.5 W/mK in the thickness direction. The second semiconductor element 7 was in the shape of a square of 5 mm×5 mm and had a thickness of 0.1 mm. The thermal conductivity of the second semiconductor element 7 was 117.5 W/mK in the plane direction at 25° C. The resin portion which covers the second semiconductor element 7 was in the shape of a square of 11.5 mm×11.5 mm and had a thickness of 0.45 mm. The thermal conductivity of the resin portion was 0.8 W/mK. The number of the connection terminals 8 formed was 120, and the connection terminals 8 were in the shape of a square prism having a section which is a square of 0.34 mm×0.34 mm and having a height of 0.2 mm.

As the heat dissipating member 10, the heat dissipating member 10 illustrated in FIG. 4B having four openings 11 provided therein was used. The outer shape of the heat dissipating member was based on a square of 13.5 mm×13.5 mm and the dissipating member had a thickness of 0.1 mm. The heat dissipating member 10 was disposed so as to hang over the respective sides of the semiconductor packages 1 and 5 by 1 mm. The area of the outer shape of the heat dissipating member 10 was 182.25 mm². The size of a portion of the heat dissipating member 10 which was adhered to the second wiring substrate 6 was 5 mm×5 mm. The area of one opening was 23.5625 mm², and the sum of the areas of the four openings was 94.25 mm². The thermal conductivity of the heat dissipating member 10 was 137 W/mK in the plane direction.

The simulation was performed with regard to the behavior of heat from the semiconductor package 5 obtained when electric power of 1.5 W was applied to the first semiconductor package 1 and electric power of 1.2 W was applied to the second semiconductor package 5. The result of the simulation was that the amount of heat dissipated from the semiconductor package 5 into the air above was 0.25 W while the amount of heat dissipated into the air below was 0.16 W. Further, the amount of heat transferred from the semiconductor package 5 via the heat dissipating member 10 to the first semiconductor package 1 was 0.18 W while the amount of heat transferred via the connection terminals 8 to the first semiconductor package 1 was 0.46 W. Further, the amount of heat dissipated from the semiconductor package 5 via the heat dissipating member 10 into the air was 0.14 W. Further, at that time, the temperature of the first semiconductor element 3 was 126° C. and the temperature of the second semiconductor element 7 was 134° C. The result is shown in Table 1.

With regard to Example 1, of the heat of 1.2 W applied to the second semiconductor package 5, 0.55 W was dissipated and 0.64 W was transferred. Therefore, heat of 1.19 W in total was released from the second semiconductor package 5 and the amount of heat which remained in the second semiconductor package 5 was 0.01 W.

Comparative Example 1

Figure 6A:
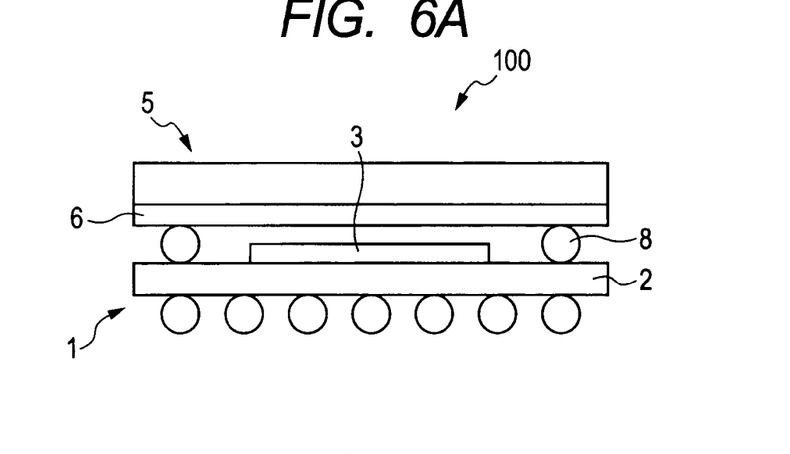
FIGS. 6A, 6B and 6C are sectional views of conventional stacked semiconductor devices.

For the sake of comparison to Example 1, a stacked semiconductor device 100 was prepared as Comparative Example 1 in which a heat dissipating member was not disposed and the first semiconductor package 1 and the second semiconductor package 5 were thermally connected to each other only via the connection terminals 8. FIG. 6A is a schematic view of the stacked semiconductor device 100. The specifications of the first semiconductor package 1 and the second semiconductor package 5 were similar to those in Example 1, but the number of the connection terminals 8 was 160.

In the case of Comparative Example 1, heat generated from the second semiconductor element 7 of the second semiconductor package 5 is released by the following three paths.

(1) heat dissipation into the air above the second semiconductor package.

(2) heat dissipation into the air below the second semiconductor package.

(4) heat transfer via the connection terminals 8 to the first wiring substrate 2.

Similarly to Example 1, the simulation was performed with regard to the behavior of heat from the semiconductor package 5 obtained when electric power of 1.5 W was applied to the first semiconductor package 1 and electric power of 1.2 W was applied to the second semiconductor package 5. The result of the simulation was that the amount of heat dissipated from the semiconductor package 5 into the air above was 0.31 W while the amount of heat dissipated into the air below was 0.25 W. Further, the amount of heat transferred via the connection terminals 8 to the first wiring substrate 2 was 0.61 W. Further, at that time, the temperature of the first semiconductor element 3 was 126° C. and the temperature of the second semiconductor element 7 was 142° C. The result is shown in Table 1.

With regard to Comparative Example 1, of the heat of 1.2 W applied to the second semiconductor package 5, 0.56 W was dissipated and 0.61 W was transferred. Therefore, heat of 1.17 W in total was released from the second semiconductor package 5 and the amount of heat which remained in the second semiconductor package 5 was 0.03 W. More specifically, the amount of heat which remained in the second semiconductor package 5 was three times as much as that in Example 1, which caused the temperature of the second semiconductor element 7 to be higher by 8° C.

Comparative Example 2

Figure 6B:
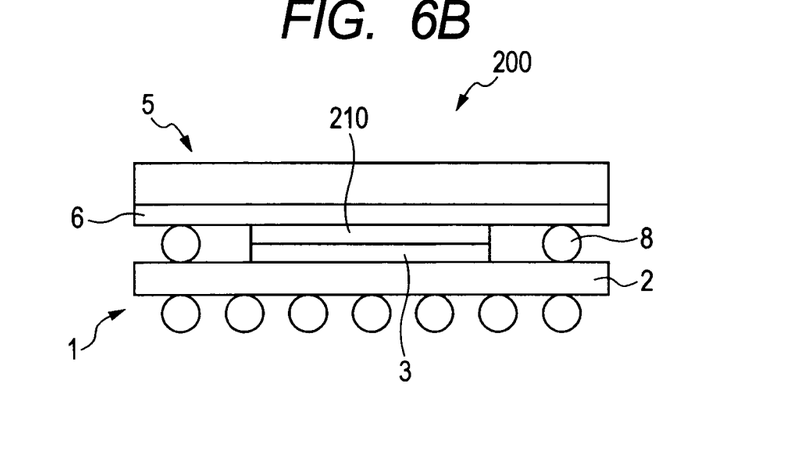

For the sake of comparison to Example 1, a stacked semiconductor device 200 was prepared as Comparative Example 2 in which a heat dissipating member was not disposed and the semiconductor element 3 mounted in the first semiconductor package 1 and the second semiconductor package 5 were connected to each other via a conductive resin 210. FIG. 6B is a schematic view of the stacked semiconductor device 200. The specifications of the first semiconductor package 1 and the second semiconductor package 5 were similar to those in Example 1, but the number of the connection terminals 8 was 160.

In the case of Comparative Example 2, heat generated from the second semiconductor element 7 of the second semiconductor package 5 is released by the following four paths.

(1) heat dissipation into the air above the second semiconductor package.

(2) heat dissipation into the air below the second semiconductor package.

(3) heat transfer via the conductive resin 210 and the semiconductor element 3 to the first wiring substrate 2.
(4) heat transfer via the connection terminals 8 to the first wiring substrate 2.

Similarly to Example 1, the simulation was performed with regard to the behavior of heat from the second semiconductor package 5 obtained when electric power of 1.5 W was applied to the first semiconductor package 1 and electric power of 1.2 W was applied to the second semiconductor package 5. The result of the simulation was that the amount of heat dissipated from the second semiconductor package 5 into the air above was 0.29 W while the amount of heat dissipated into the air below was 0.15 W. Further, the amount of heat transferred from the semiconductor package 5 via the conductive resin 210 and the semiconductor element 3 to the first wiring substrate 2 was 0.27 W while the amount of heat transferred via the connection terminals 8 to the first wiring substrate 2 was 0.47 W. Further, at that time, the temperature of the first semiconductor element 3 was 129° C. and the temperature of the second semiconductor element 7 was 136° C. The result is shown in Table 1.

With regard to Comparative Example 2, of the heat of 1.2 W applied to the second semiconductor package 5, 0.44 W was dissipated and 0.74 W was transferred. Therefore, heat of 1.18 W in total was released from the second semiconductor package 5 and the amount of heat which remained in the second semiconductor package 5 was 0.02 W. More specifically, the amount of heat which remained in the second semiconductor package 5 was twice as much as that in Example 1, which caused the temperature of the second semiconductor element 7 to be higher by 2° C.

Comparative Example 3

Figure 6C:
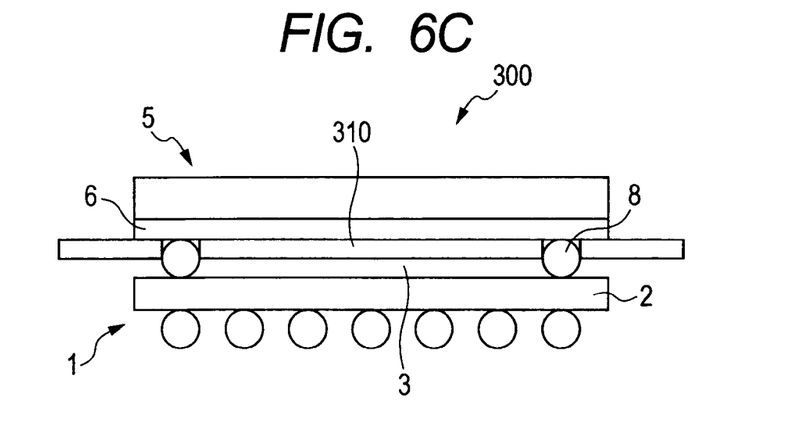

For the sake of comparison to Example 1, a stacked semiconductor device 300 was prepared as Comparative Example 3 in which a heat dissipating member was disposed but a heat dissipating member 310 was connected via a conductive resin only to the second semiconductor package 5. FIG. 6C is a schematic view of the stacked semiconductor device 300. Here, the first semiconductor package 1 and the second semiconductor package 5 were thermally connected to each other only via the connection terminals 8. The specifications of the first semiconductor package 1, the second semiconductor package 5, and the heat dissipating member 310 were similar to those in Example 1, but the number of the connection terminals 8 was 120.

In the case of Comparative Example 3, heat generated from the second semiconductor element 7 of the second semiconductor package 5 is released by the following four paths.
(1) heat dissipation into the air above the second semiconductor package.
(2) heat dissipation into the air below the second semiconductor package.
(4) heat transfer via the connection terminals 8 to the first wiring substrate 2.
(5) heat dissipation into the air via the heat dissipating member 310.

Similarly to Example 1, the simulation was performed with regard to the behavior of heat from the second semiconductor package 5 obtained when electric power of 1.5 W was applied to the first semiconductor package 1 and electric power of 1.2 W was applied to the second semiconductor package 5. The result of the simulation was that the amount of heat dissipated from the second semiconductor package 5 into the air above was 0.28 W while the amount of heat dissipated into the air below was 0.11 W. Further, the amount of heat transferred via the connection terminals 8 to the first semiconductor package 1 was 0.50 W. The amount of heat dissipated from the semiconductor package 5 via the heat dissipating member 310 into the air was 0.30 W. Further, at that time, the temperature of the first semiconductor element 3 was 126° C. and the temperature of the second semiconductor element 7 was 137° C. The result is shown in Table 1.

With regard to Comparative Example 3, of the heat of 1.2 W applied to the second semiconductor package 5, 0.69 W was dissipated and 0.50 W was transferred. Therefore, heat of 1.19 W in total was dissipated or transferred, and the amount of heat which remained in the second semiconductor package 5 was 0.01 W, which was the same as that in Example 1. However, the effect of suppressing temperature rise by heat dissipation was smaller than that by heat transfer, and thus, the temperature of the second semiconductor element 7 was higher by 3° C.

TABLE 1

|  | Example 1 | Comparative Example 1 | Comparative Example 2 | Comparative Example 3 |
| --- | --- | --- | --- | --- |
| Path (1) heat dissipation (W) | 0.25 | 0.31 | 0.29 | 0.28 |
| Path (2) heat dissipation (W) | 0.16 | 0.25 | 0.15 | 0.11 |
| Path (3) heat transfer (W) | 0.18 | — | 0.27 | |
| Path (4) heat transfer (W) | 0.46 | 0.61 | 0.47 | 0.50 |
| Path (5) heat dissipation (W) | 0.14 | — | — | 0.30 |
| Amount of dissipated heat in total (W) | 0.55 | 0.56 | 0.44 | 0.69 |
| Amount of transferred heat in total (W) | 0.64 | 0.61 | 0.74 | 0.50 |
| Amount of heat in total (W) | 1.19 | 1.17 | 1.18 | 1.19 |
| Temperature of semiconductor element 3 (° C.) | 126 | 126 | 129 | 126 |
| Temperature of semiconductor element 7 (° C.) | 134 | 142 | 136 | 137 |

According to the present invention, the heat dissipating member disposed between the pair of semiconductor packages is brought into thermal contact with both of the semiconductor packages. Therefore, heat generated from the semiconductor element of the semiconductor package disposed relatively farther from the motherboard of the pair of semiconductor packages is transferred via the heat dissipating member to the semiconductor package disposed relatively nearer to the motherboard, and finally, may be transferred to the motherboard. In this way, a path over which heat is transferred to the motherboard is formed in addition to the path over which heat is dissipated into the air, and thus, the effect of lowering the temperatures of the semiconductor elements of the respective semiconductor packages may be enhanced.

Second Embodiment

Figure 5:
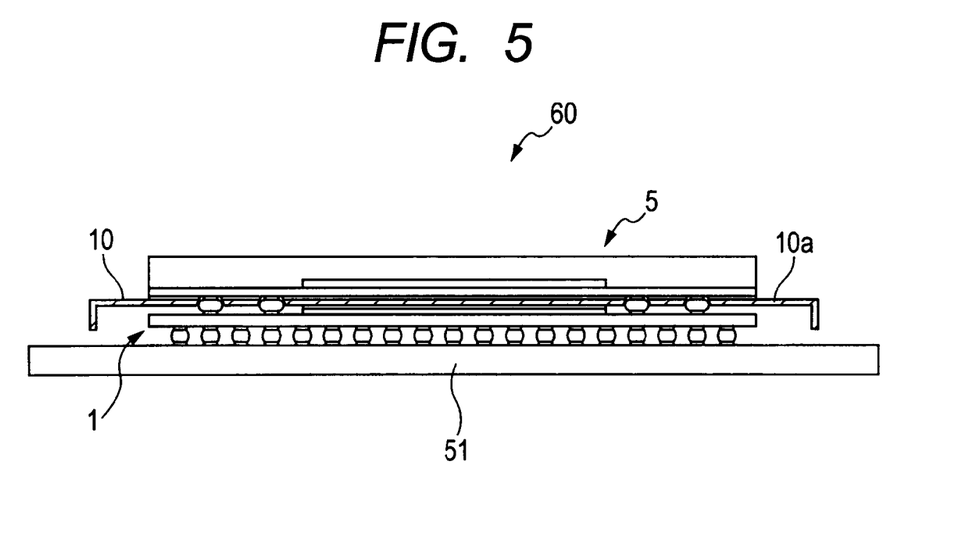
FIG. 5 is a sectional view of a stacked semiconductor device according to a second embodiment.

Next, a second embodiment for carrying out the present invention is described in detail with reference to the drawings. FIG. 5 is a sectional view of a stacked semiconductor device 60 according to the second embodiment of the present invention. Note that, like reference symbols are used to designate members similar to those in FIGS. 1A and 1B.

A heat dissipating member 10a of FIG. 5 is in such a shape that edges of the overhang are bent downward (toward the motherboard). Note that, the bent portion only needs to be provided at least at one edge of the overhang. With regard to the direction of the bending, it is more efficient to bend the overhang toward a lower atmospheric temperature side, and in this embodiment, the overhang is bent to the side of the first semiconductor package 1 which is directly mounted on the motherboard 51 and thus heat is more liable to be released therefrom.

With regard to the shape of the overhang, the heat dissipation effect thereof was confirmed in a simulation similar to that in Example 1. In the simulation, a case in which the amount of the overhang was 1.5 mm in the horizontal direction and a case in which the amount of the overhang was 1 mm in the horizontal direction and then 0.5 mm of the overhang was bent downward were compared. As a result, it was confirmed that the temperature of the second semiconductor package 5 was lower by 1.5° C. when the overhang was bent downward.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-150242, filed Jun. 30, 2010, No. 2011-093906, filed Apr. 20, 2011 which are hereby incorporated by reference herein in their entirety.

The invention claimed is:

1. A stacked semiconductor device, comprising:
a first semiconductor package including:
   a first wiring substrate;
   a first semiconductor element mounted on the first wiring substrate; and
   multiple first connection terminals formed on a surface of the first wiring substrate;
a second semiconductor package including:
   a second wiring substrate;
   a second semiconductor element mounted on the second wiring substrate; and
   multiple second connection terminals formed on a surface of the second wiring substrate,
the second semiconductor package being disposed so as to be stacked on the first semiconductor package via the multiple second connection terminals; and
a heat dissipating member, which
   is disposed between the first semiconductor package and the second semiconductor package,
   is in thermal contact with both the first semiconductor package and the second semiconductor package,
   has openings formed therein at locations corresponding to the multiple second connection terminals so as not to be in contact with the multiple second connection terminals, and
   is formed so as to hang over outer peripheral portions of the first semiconductor package and the second semiconductor package,
wherein the heat dissipating member is brought into surface contact with the corresponding wiring substrate of one semiconductor package of the pair of the first semiconductor package and the second semiconductor package and is brought into surface contact with the corresponding semiconductor element of another semiconductor package thereof, and
wherein the multiple first connection terminals and the multiple second connection terminals comprise ball electrodes, and the heat dissipating member openings are each formed in a tapered shape which gradually widens from the second semiconductor package side toward the first semiconductor package side.

2. The stacked semiconductor device according to claim 1, wherein the heat dissipating member has an overhang which is bent toward a motherboard, the overhang being formed so as to hang over the outer peripheral portion of at least one of the first semiconductor package and the second semiconductor package.

* * * * *